(12) United States Patent
Miyazoe et al.

(10) Patent No.: US 10,923,348 B2
(45) Date of Patent: Feb. 16, 2021

(54) GATE-ALL-AROUND FIELD EFFECT TRANSISTOR USING TEMPLATE-ASSISTED-SLECTIVE-EPITAXY

(71) Applicant: International Business Machines Corporation, Armonk, NY (US)

(72) Inventors: Hiroyuki Miyazoe, White Plains, NY (US); Cheng-Wei Cheng, White Plains, NY (US); Sanghoon Lee, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/424,830

(22) Filed: May 29, 2019

(65) Prior Publication Data

US 2020/0381250 A1 Dec. 3, 2020

(51) Int. Cl.
*H01L 21/02* (2006.01)
*C30B 29/40* (2006.01)
(Continued)

(52) U.S. Cl.
CPC ........ *H01L 21/02645* (2013.01); *C30B 25/04* (2013.01); *C30B 25/18* (2013.01); *C30B 29/40* (2013.01); *H01L 21/0228* (2013.01); *H01L 21/02181* (2013.01); *H01L 21/02546* (2013.01); *H01L 21/02603* (2013.01);
(Continued)

(58) Field of Classification Search
CPC ......... H01L 21/02645; H01L 29/78696; H01L 29/78681; H01L 29/0673; H01L 29/66742; H01L 21/0228; H01L 29/42392; H01L 29/66522; H01L 21/02546; H01L 21/02603; H01L 21/31122;
(Continued)

(56) References Cited

U.S. PATENT DOCUMENTS 5,369,290 A 11/1994 Kawasaki et al.
5,463,978 A 11/1995 Larkin et al.
(Continued)

OTHER PUBLICATIONS

C. Fonstad et al., "Vapor phase growth of stannic oxide single crystals." Journal of the Electrochemical Society, vol. 116, No. 9, pp. 1269-1271 1969.
H. Schmid et al., "Template-assisted selective epitaxy of III-V nanoscale devices for co-planar heterogeneous integration with Si," Applied Physics Letters, vol. 106, No. 23, 233101, 5 pp. 2015.
(Continued)

*Primary Examiner* — Ahmed N Sefer
(74) *Attorney, Agent, or Firm* — Fleit Intellectual Property Law; Jon Gibbons

(57) ABSTRACT

A method for forming a semiconductor device comprises receiving a substrate with a silicon oxide layer formed over the substrate and a nano-wire based semiconductor device formed using template-assisted-selective epitaxy (TASE) over the silicon oxide layer. The semiconductor device serves as a seed layer to form at least one i) silicon nanowire which extends laterally in the semiconductor device and over the silicon oxide layer, ii) tunnel which extends laterally in the semiconductor device and over the silicon oxide layer, and iii) nuclei on the silicon oxide layer. A film is deposited over the semiconductor device and the silicon oxide layer. The film is removed over silicon oxide layer outside the semiconductor device. Next the nuclei on the silicon oxide layer are removed. Finally, the silicon oxide layer over the semiconductor device is removed.

20 Claims, 9 Drawing Sheets

(51) Int. Cl.
  *H01L 21/311* (2006.01)
  *H01L 29/66* (2006.01)
  *H01L 29/06* (2006.01)
  *H01L 29/423* (2006.01)
  *H01L 29/786* (2006.01)
  *C30B 25/04* (2006.01)
  *C30B 25/18* (2006.01)

(52) U.S. Cl.
  CPC .... *H01L 21/31122* (2013.01); *H01L 29/0673* (2013.01); *H01L 29/42392* (2013.01); *H01L 29/66522* (2013.01); *H01L 29/66742* (2013.01); *H01L 29/78681* (2013.01); *H01L 29/78696* (2013.01)

(58) Field of Classification Search
  CPC ... H01L 21/02181; C30B 25/04; C30B 25/18; C30B 29/40
  See application file for complete search history.

(56) References Cited

U.S. PATENT DOCUMENTS

| | | |
|---|---|---|
| 6,582,986 B2 | 6/2003 | Kong et al. |
| 2012/0146000 A1* | 6/2012 | Bangsaruntip .... H01L 29/78645 257/29 |
| 2012/0319178 A1* | 12/2012 | Chang ............... H01L 29/78696 257/287 |
| 2013/0001517 A1* | 1/2013 | Bangsaruntip .... H01L 29/42392 257/29 |
| 2015/0214433 A1 | 7/2015 | Tran et al. |
| 2016/0155798 A1 | 6/2016 | Borg et al. |
| 2016/0351391 A1 | 12/2016 | Borg et al. |
| 2017/0104058 A1 | 4/2017 | Borg et al. |

OTHER PUBLICATIONS

X. Sun et al., "High performance and low leakage current InGaAs-on-silicon FinFETs with 20 nm gate length," Symposium on VLSI Technology, pp. T40-T41. 2017.

* cited by examiner

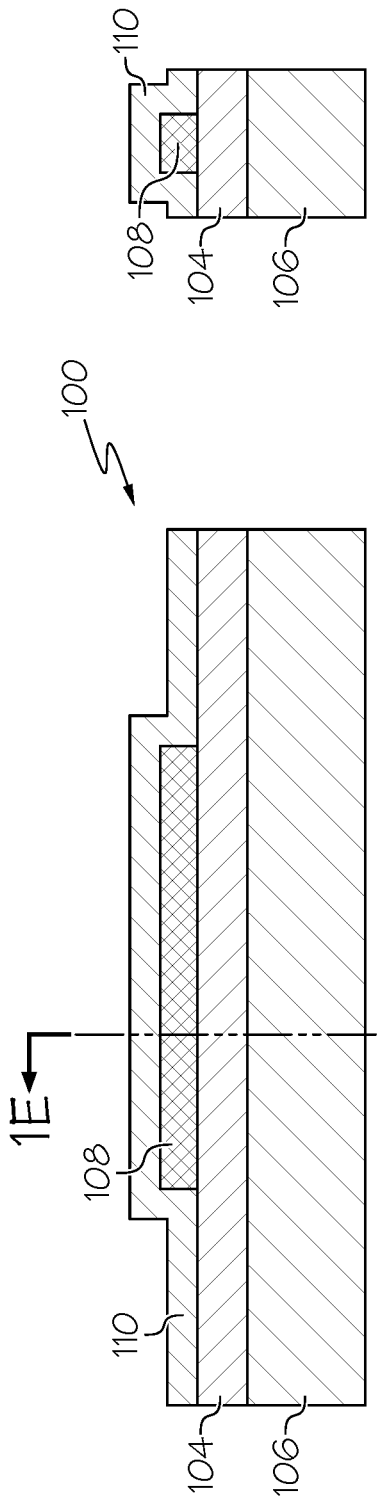
FIG. 1D (PRIOR ART)
FIG. 1E (PRIOR ART)
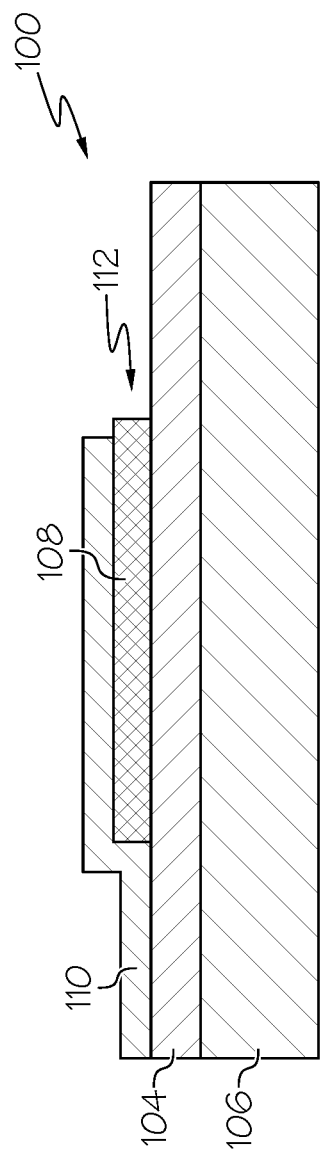
FIG. 1F (PRIOR ART)

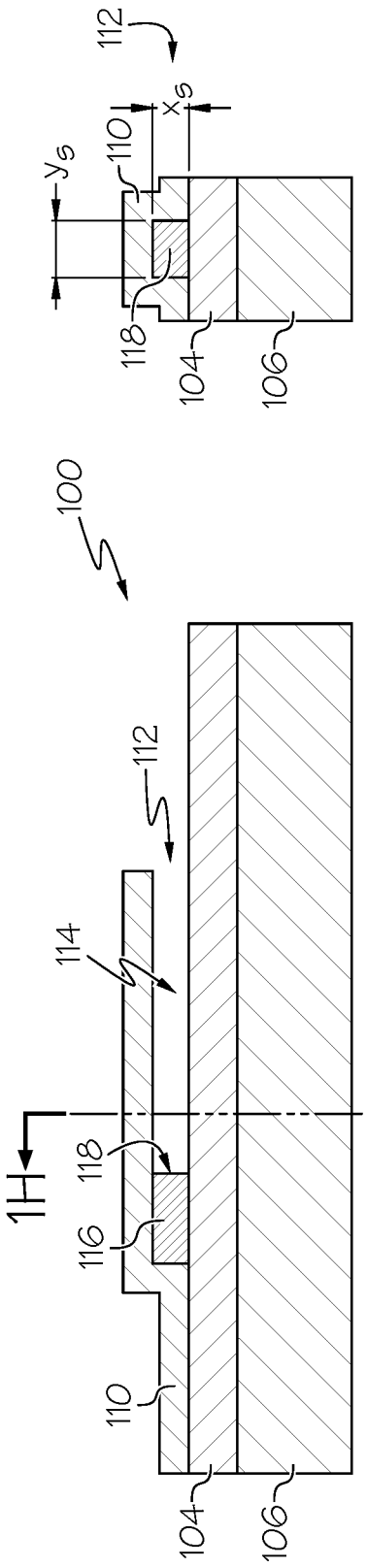
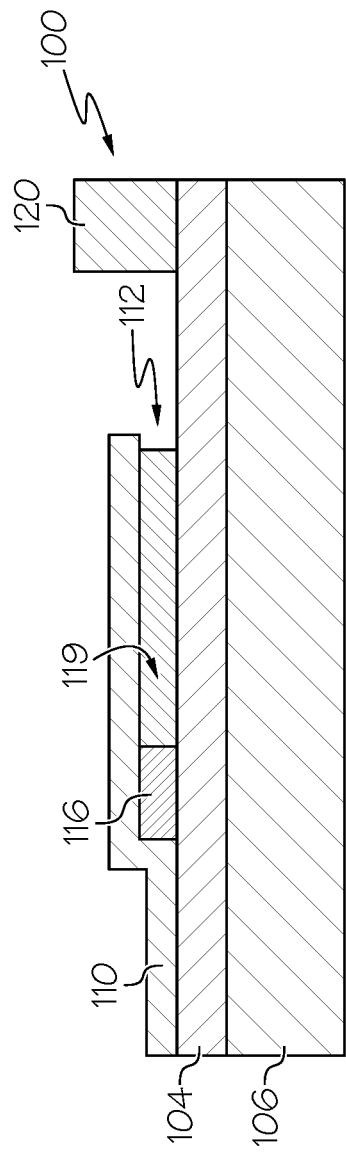
FIG. 1H (PRIOR ART)
FIG. 1G (PRIOR ART)
FIG. 1I (PRIOR ART)

GATE-ALL-AROUND FIELD EFFECT TRANSISTOR USING TEMPLATE-ASSISTED-SLECTIVE-EPITAXY

BACKGROUND OF THE INVENTION

The present invention relates generally to the electrical, electronic and computer arts, and, more particularly, to forming a gate-all-around (GAA) field effect transistors (FET) in integrated circuits with silicon substrates.

Multi-gate field effect transistors (FETs) are of considerable interest because of their superior electrostatic integrity, as well as their promise of lower supply voltages, reduced threshold voltages, and extended scalability. FinFETs are one form of such multi-gate device. In a FinFET, a gate typically accesses two or three faces of a channel. However, as the fin width of FinFETs approaches five nanometers, channel width variation may cause undesirable variability and mobility loss.

One possible technology that may be able to circumvent this problem is gate-all-around (GAA) FETs. In a GAA FET, a gate is made to surround a channel, which may be structured as a nanowire or a nanosheet (a nanosheet being a nano-sized rectangular cuboid). Such an arrangement provides for the greatest capacitive coupling between the gate and the channel. Incorporating indium gallium arsenide into such GAA FETs may be of particular benefit because of its extremely high electron mobility when compared to silicon, as well as lower operation voltage.

Integrating highly crystalline III-V materials such as indium gallium arsenide with silicon has historically been difficult because of lattice mismatches. One promising technique for effectively growing III-V materials on silicon substrates is template-assisted-selective-epitaxy (TASE). In a TASE-based process the fabrication steps include shape definition, nanostructure formation by oxide deposition and Si back-etching, selective epitaxy, and template oxide removal. With such techniques, dislocation defects may be significantly reduced or eliminated. Nevertheless, TASE processes dictate a specific layout for the III-V devices. Thus the formation of III-V GAA FETs using TASE remains challenging.

SUMMARY OF THE INVENTION

In one embodiment, a method for forming a semiconductor device structure comprises receiving a substrate with a silicon oxide layer formed over the substrate and a nano-wire based semiconductor device formed using template-assisted-selective epitaxy (TASE) over the silicon oxide layer. The nano-wire based semiconductor device serves as a seed layer to form i) at least one silicon nanowire which extends laterally in the nano-wire based semiconductor device and over the silicon oxide layer, ii) at least one tunnel which extends laterally in the nano-wire based semiconductor device and over the silicon oxide layer, and iii) at least one nuclei on the silicon oxide layer. The nanowire in one example is a III-V chemical compound nanowire. A film is deposited over the nano-wire based semiconductor device and the silicon oxide layer. The film in one example is a $HfO_2$ film deposited using atomic layer deposition. The film is removed over silicon oxide layer outside the nano-wire based semiconductor device. The film in one example is removed using an anisotropic dry etch. Next the nuclei on the silicon oxide layer is removed. The nuclei may be removed using aqueous mixture of hydrochloric acid and an oxidizing agent includes a mixture of hydrochloric acid, hydrogen peroxide, and deionized water. In another example the removal can be carried out by using a mixture of includes of a mixture of ammonium hydroxide and hydrogen peroxide and deionized water. The remaining protective film is removed by isotropic etch, such as reactive ion etching (RIE). In another example the film can be removed using inductively coupled plasma (ICP) with $BCL_3$ and/or $CHF_3$. Finally, the silicon oxide layer over the nano-wire based semiconductor device is removed.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which:

FIGS. 1a to 1i are schematic cross-sectional views illustrating successive stages in a semiconductor device formed using template-assisted-selective epitaxy (TASE) over a silicon oxide layer according to the prior art;

DETAILED DESCRIPTION

Figure 1A:
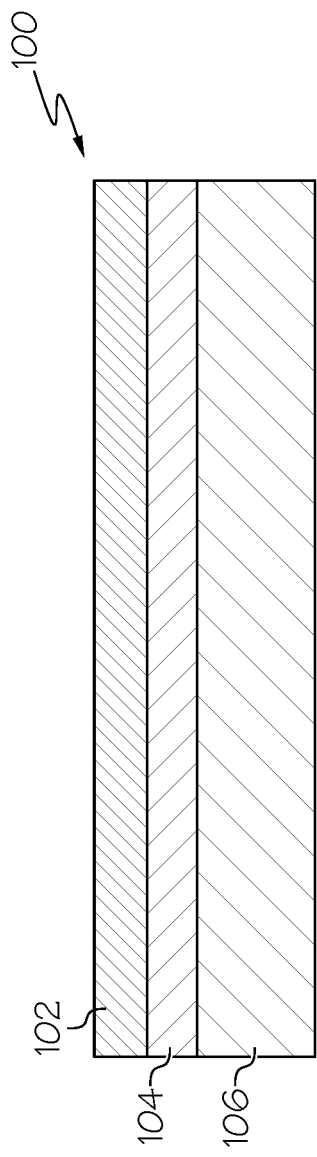

It is to be understood that the various layers and/or regions shown in the accompanying drawings are not drawn to scale, and that one or more layers and/or regions of a type commonly used in metal-oxide semiconductor (MOS) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with various embodiments of the present invention may be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

As used herein, "vertical" refers to a direction perpendicular to a substrate in the views herein. As used herein, "horizontal" refers to a direction parallel to a substrate views herein. As used herein, "thickness" refers to a size of an element (e.g., a layer, trench, hole, etc.) in the cross-sectional views measured from a bottom surface to a top surface, or a left side surface to a right side surface of the element, and/or measured with respect to a surface on which the element is directly on.

Unless otherwise specified, as used herein, "height" or "height above a substrate" refers to a vertical size of an element (e.g., a layer, trench, hole, etc.) in the cross-sectional views measured from a top surface of the substrate to a top surface of the element. A thickness of an element can be equal to a height of the element if the element is directly on the substrate. As used herein, "lateral", "lateral side", and "lateral surface", and the like, refer to a side surface of an element (e.g., a layer, an opening, a fin, etc.), such as a left or right side surface in the cross-sectional views herein.

As used herein, the terms "width" or "width value", and the like, refer to a distance from a start point on a first structure to an end point on the same structure, in a critical dimension. There can be specified a vertical width (e.g., a thickness) of the structure or a horizontal width of the structure.

It will also be understood that when an element such as a layer, region or substrate is referred to as being "on" or "over" another element, it can be directly on the other element or intervening elements may also be present. Similar but inverse meaning will be understood for an element such as a layer, region, or substrate that is referred to as being "under" or "below" another element. It can be directly under the other element or intervening elements may also be present. In contrast, when an element is referred to as being "directly on" or "directly over", or alternatively referred to as being "directly under" or "directly below" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), field-effect transistor (FET), fin field-effect transistor (finFET), metal-oxide-semiconductor field-effect transistor (MOSFET), and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

Deposition may be by any process that grows, coats, or otherwise transfers a material onto the wafer. Available technologies include, for example, physical vapor deposition (PVD), chemical vapor deposition (CVD), electrochemical deposition (ECD), molecular beam epitaxy (MBE) and more recently, atomic layer deposition (ALD) among others.

The terms "epitaxially growing", "epitaxial growth", "epitaxially grown", and their variants, mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatus that are suitable for use in one or more embodiments include, e.g., rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). A number of different sources can be used for the deposition of the various layers discussed herein. For example, the gas source for the deposition of epitaxial semiconductor material can include a silicon containing gas source, a germanium containing gas source, a combination thereof, and/or the like. Examples of silicon containing gas sources are silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. Examples of germanium containing gas sources are germane, digermane, halogermane, dichlorogermane, trichlorogermane, tetrachlorogermane and combinations thereof.

Removal may be by any process that removes material from the wafer; examples include etch processes (either wet or dry), reactive ion etching (RIE), and chemical-mechanical planarization (CMP).

Patterning refers to the shaping or altering of deposited materials, and can be generally referred to as lithography by applying a patterned mask. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist can be removed by plasma ashing.

Modification of electrical properties has historically entailed doping transistor sources and drains (originally by diffusion furnaces and later by ion implantation). These doping processes are followed by furnace annealing or, in advanced devices, by rapid thermal annealing (RTA); annealing serves to activate the implanted dopants. Modification of electrical properties now also extends to the reduction of a material's dielectric constant in low-k insulators trench exposure to ultraviolet light in UV processing (UVP). Modification is frequently achieved by oxidation, which can be carried out to create semiconductor-insulator junctions, such as in the local oxidation of silicon (LOCOS) to fabricate metal oxide field effect transistors.

Various embodiments will now be discussed in further detail with regard to semiconductor devices and methods of manufacturing the same and, in particular, to a fabrication method and structure of III-V gate-all-around (GAA) field effect transistors (FET) in integrated circuits with silicon substrates using a template-assisted-selective epitaxy (TASE) process. Epitaxy is the process of depositing a mono-crystalline film on a mono-crystalline substrate. The deposited film is denoted as an epitaxial film or epitaxial layer. The substrate acts as a seed crystal and the deposited film takes on a lattice structure and orientation identical to those of the substrate.

In a TASE-based process the fabrication steps include shape definition, nanostructure formation by oxide deposition and Si back-etching, selective epitaxy, and template oxide removal. With such techniques, dislocation defects may be significantly reduced or eliminated.

More specifically, the inventors have observed that during the epitaxy of III-V materials, unwanted nucleation happens outside of device area. Nucleation is the initial process that occurs in the formation of a crystal from a solution, a liquid, or a vapor, in which a small number of ions, atoms, or molecules become arranged in a pattern characteristic of a crystalline solid, forming a site upon which additional particles are deposited as the crystal grows. These nuclei are difficult to remove mechanically without damaging the device, such as by solvent cleaning and surface polishing. Disclosed is a process for removing unwanted nuclei outside of the device area while leaving the device area intact.

The embodiments of the claimed invention for removing nuclei for TASE includes using an atomic layer deposition (ALD) film to seal III-V epitaxy grown in templates and unintentionally grown nuclei outside of device areas. An un-isotropic dry etch is used to exclusively open the ALD film on top of the nuclei outside the device areas. Next an isotropic and selective wet etch to remove nuclei while the III-V in the templates are blocked by the ALD film. Selective etch is used to remove the remaining ALD film.

FIGS. 1a to 1i are schematic cross-sectional views illustrating successive stages in a semiconductor device formed using template-assisted-selective epitaxy (TASE) over a silicon oxide layer according to the prior art.

Turning now to FIG. 1a is a schematic cross-section through a semiconductor-on-insulator wafer 100 which provides the substrate for the first nanowire fabrication process. Such a wafer might be a SOI (Silicon On Insulator) wafer, a GeOI (Germanium On Insulator) wafer, or an XOI wafer having any other semiconductor material on insulator. These wafers include three layers. A thin, typically 10-200 nm thick, semiconductor device layer (Si, Ge or X) 102 is bonded or deposited on a silicon oxide insulating layer 104 which in turn overlies a thick silicon handle wafer 106. The semiconductor device layer 102 serves as a seed layer for the nanowire fabrication process, the semiconductor material of this layer functioning as a seed material for growth of the nanowire as described further below.

Figure 1B:
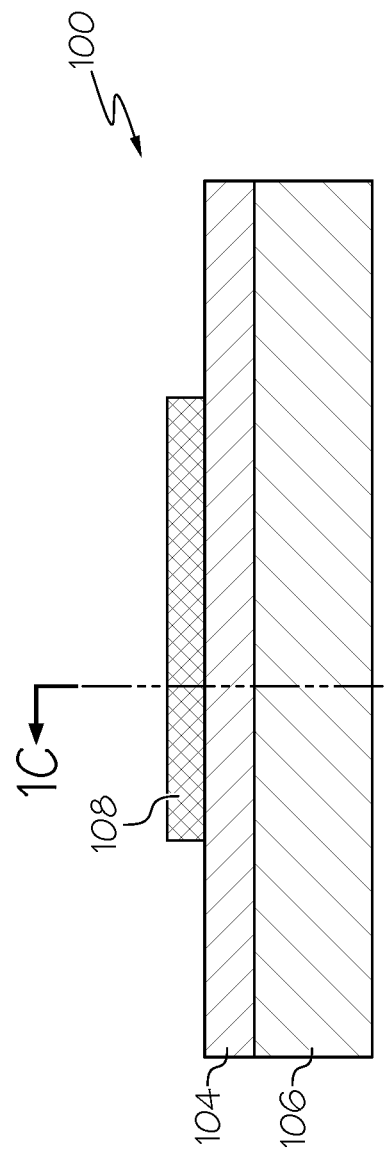
Figure 1C:
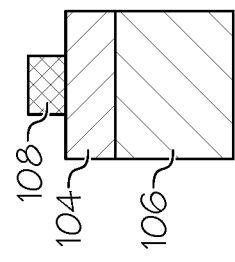

A first stage of the fabrication process involves forming a template for the nanowire. This template defines the shape of the nanowire to be formed, and thus defines an elongate tunnel the dimensions of which are determined by the dimensions of the nanowire to be formed. A first step in formation of the nanowire template is illustrated in FIG. 1b. The device layer, or seed layer, 102 is patterned to form a seed region 108 in the shape of the interior of the template. This patterning step exposes the insulating layer 104 around the seed region 108, and can involve reducing the thickness of device layer 102 to give the desired thickness of seed region 108. The seed region 108 defines the shape of the target nanowire structure. In this simple example, the seed region 108 is an elongate, linear region of uniform rectangular cross-section as illustrated in FIG. 1b which shows a schematic cross-section on A-A of the left-hand view in the FIG. 1c. The transverse cross-section of seed region 108 has a thickness z and a width y, where each of these dimensions is no greater than 100 nm in accordance with the required dimensions of the nanowire to be formed here. Each dimension y, z is generally less than 100 nm, and typically in a range of from 10 to 100 nm.

In a second step of the fabrication process, a masking layer 110 is formed over, and in contact with, the seed region 108 and the surrounding insulating layer 104. The result of this step is illustrated in FIG. 1*d*. A cross-section on B-B of the left-hand view is shown in FIG. 1*e*. The masking layer 110 thus covers the entire surface of the seed region 108. This masking layer and the insulating layer underlying seed region 108 will together form the nanowire template following additional processing steps described below. The material of the masking layer is selected to have a low sticking coefficient, and hence low nucleation probability, for the semiconductor material of the nanowire to be grown. This masking layer is typically an insulating layer, e.g. of an oxide such as silicon oxide or silicon nitride, but might also be a layer of carbon or other material which suppresses deposition of the semiconductor on the masking layer during the subsequent selective growth of the nanowire.

In a next step of the process, illustrated in FIG. 1*f*, an opening 112 is defined in the masking layer 110. The opening 112 is formed by removing part of the masking layer overlying one end of seed region 108 to expose the seed region. Next, part of the seed region 108 is removed, e.g. by etching, via the opening 112 to form the elongate tunnel, or nanotube, 114 which provides the hollow interior of the nanowire template. This stage is illustrated in FIG. 1*g* and FIG. 1*h*. A remaining part 116 of the seed region, such as a Si<111> surface, provides a seed surface 118 which is exposed to the tunnel 114. In this preferred embodiment, the seed surface 118 extends across the transverse tunnel cross-section substantially perpendicular to the longitudinal axis of the tunnel, thereby occluding one end of the tunnel. The tunnel 114 thus extends laterally over the substrate wafer between the seed surface 118 and the opening 112 in the resulting nanowire template. FIG. 1*g* depicts a cross-section on C-C of the left-hand view here and shows the seed surface 118. The seed surface has width $y_s$ and breadth $z_s$, (where $z_s$ is shown in FIG. 1*i*) and the area $A_s = y_s \times z_s$ of this surface is no greater than $10^4$ nm$^2$. Since the dimensions of the seed surface correspond to the transverse dimensions of the desired nanowire in this embodiment, each of dimension $y_s$ and $z_s$ is no greater than 100 nm here. The seed surface area is thus generally less than $10^4$ nm$^2$ in this preferred embodiment, and is typically between 100 and $10^4$ nm$^2$. Moreover, in this preferred embodiment, the area $A_s$ of the seed surface is such that the ensuing selective growth of the nanowire proceeds from a single nucleation point on the seed surface. This is discussed further below.

Prior to the nanowire growth step, the seed surface 118 can be cleaned if required, e.g. by flushing with a cleaning agent, to remove any surface oxidation. The next stage involves selectively growing the semiconductor nanowire in the template from the seed surface 118. This is achieved here using metal-organic vapor phase deposition (MOCVD) or migration enhanced epitaxy (MEE) of the semiconductor material via the opening 112 in the template. The semiconductor material of the nanowire is preferably a compound semiconductor such as a III-V semiconductor, or a II-VI semiconductor for example. The nanowire template is thus epitaxially filled by the compound semiconductor from seed surface 118, with the nanowire growth being confined to the tunnel 114. The result of this step is shown in FIG. 1*i* where the nanowire 119 is grown to substantially the full length of the tunnel 114. Due to restriction of the seed surface area as discussed above, the selective growth conditions are such that epitaxial growth of the nanowire proceeds from a single nucleation point on the seed surface. Nucleation at the seed surface depends on the seed surface area and the mobility of atoms diffusing over the seed surface during the deposition process. If the dimensions $y_s$, $z_s$ of the seed surface are considerably less than the average diffusion length of the atoms at the operating temperature of the process, then growth from a single nucleation point can be obtained. Precise constraints on the seed surface area will thus vary for individual processes depending on the particular materials and process parameters, but suitable values will be apparent to those skilled in the art based on the principles described herein.

During the template-assisted-selective epitaxy (TASE) process to grow of the nanowire 119, one or more undesirable III-V nuclei 120 are also formed on top of silicon oxide insulating layer as shown in FIG. 1*i*.

During the template filling process, the composition of the material can be varied if desired, and dopants can be introduced. Growth can be interrupted if required to allow etching and/or cleaning steps to be performed so as to remove parasitic deposition on the mask surfaces and to improve selectivity of the template filling process.

On completion of nanowire growth, the masking layer 110 and remaining seed region 116 can be removed, e.g. by etching, to expose the nanowire on substrate wafer 100. The nanowire 119 can then be optimized if desired, e.g. to refine the shape, reduce the length, etc., and subsequent device processing steps can be performed if appropriate to build a required device structure around the nanowire. For example, nanowire 119 can be used to build a field effect transistor such as a tunnel field effect transistor, a diode, a laser etc. using the basic nanowire structure. The nanowire 119 can also be used as a seed layer in a subsequent repeated process if desired.

The basic nanowire fabrication steps described above can be performed using well-known material processing techniques. By way of illustration, details of an exemplary process for fabricating an Indium-Arsenide nanowire on an SOI wafer are described in the following. An SOI wafer with a 70 nm device layer was processed to form the seed region 108 of FIG. 1*b* by electron beam lithography and reactive ion etching. The seed region had a length of 3 m and dimensions y, z of 70 nm each. A masking layer 110 of SiO$_2$ was deposited to a thickness of 100 nm by plasma-enhanced chemical vapor deposition. Opening 112 was formed by optical lithography and the seed region was partially removed by a tetramethylammonium hydroxide wet etch to achieve the template containing the remaining seed region 116 as shown in FIG. 1*g*. The remaining seed region 116 had a length of 2 m. The dimensions $y_s$, $z_s$ of the seed surface were 70 nm each, giving a seed surface area of $4.9 \times 10^3$ nm$^2$. The nanowire was then grown by MOCVD using the precursors trimethylindium and tertiarybutylarsenic at a molar flow ratio of 5.6/149.5 µMol/min=27 at a temperature of 520.degree. C. This produced a nanowire of length 450 nm with transverse dimensions corresponding to those of seed surface 118.

While an illustrative example is given above, it will be appreciated that the basic fabrication steps described can be used to produce nanowires of other materials, shapes and sizes. Materials and processing techniques can be selected as appropriate for a given embodiment, and suitable choices will be readily apparent to those skilled in the art.

It will be seen that the above process allows local integration of semiconductor nanowires grown laterally on a substrate wafer. By restricting the dimensions of the seed surface in this lateral-tunnel arrangement such that growth proceeds from a single nucleation center, crystal defects can be completely suppressed and defect-free nanowires achieved. High-quality nanowires are thus obtained via a convenient and inexpensive fabrication process which is compatible with CMOS processing techniques. The process is also highly flexible, permitting growth of nanowires with arbitrary shapes, dimensions and directions directly on the substrate. The shape and direction of tunnel 114 can be easily controlled when forming the template to provide nanowires with the required shapes and orientations. Since growth is confined to the tunnel, nanowire growth in a required direction is achievable irrespective of orientation of the semiconductor crystal structure to the nanowire axis. If required, the direction and cross-section of a nanowire can be varied along its length by appropriate shaping of the template in the above process. The above process therefore offers exceptional flexibility and ease of fabrication for superior-quality nanowires.

Of course, while the foregoing process description focuses solely on nanowire fabrication, other structures, whether other nanowires or other device components, can be formed at the same time. Particular process steps involved in nanowire formation, e.g. patterning, masking and etching steps etc., can thus be used simultaneously to create other structures on the substrate wafer 100. In a typical application, multiple nanowires can be fabricated simultaneously on wafer 100.

As noted above, during the template-assisted-selective epitaxy (TASE) process to grow of the nanowire 119, one or more undesirable III-V nuclei 120 are also formed on top of silicon oxide insulating layer as shown in FIG. 1*i*.

Figure 2A:
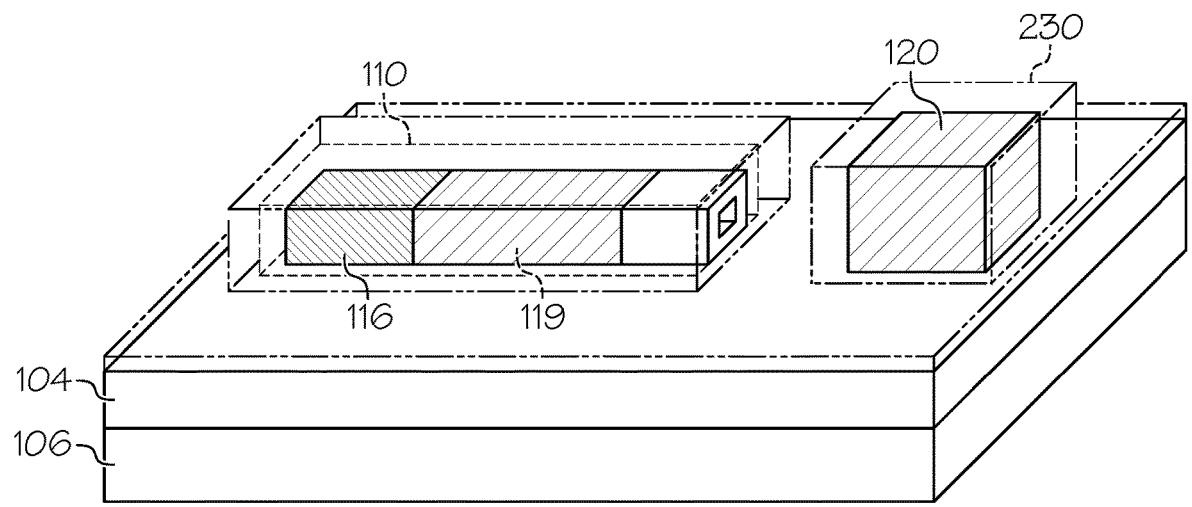
FIG. 2a is a top perspective view and FIG. 2b is a corresponding side view of a film that is conformally deposited over the structure in FIG. 1i according to one embodiment of the present invention.
Figure 2B:
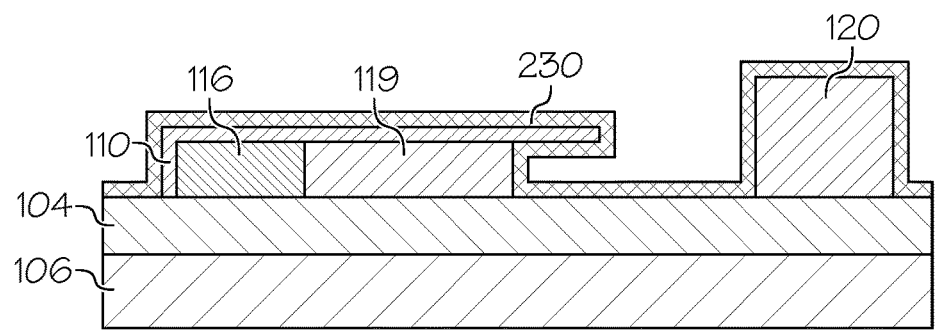

Turning to FIG. 2*a*, shown is a top perspective view and FIG. 2*b* shown is a corresponding side view of a protective film 230 that is conformally deposited over the structure in FIG. 1*i*. In one example this protective film 230 is $HfO_2$ film which is deposited using atomic layer deposition (ALD) with an approximately thickness of 15 nm.

Figure 3A:
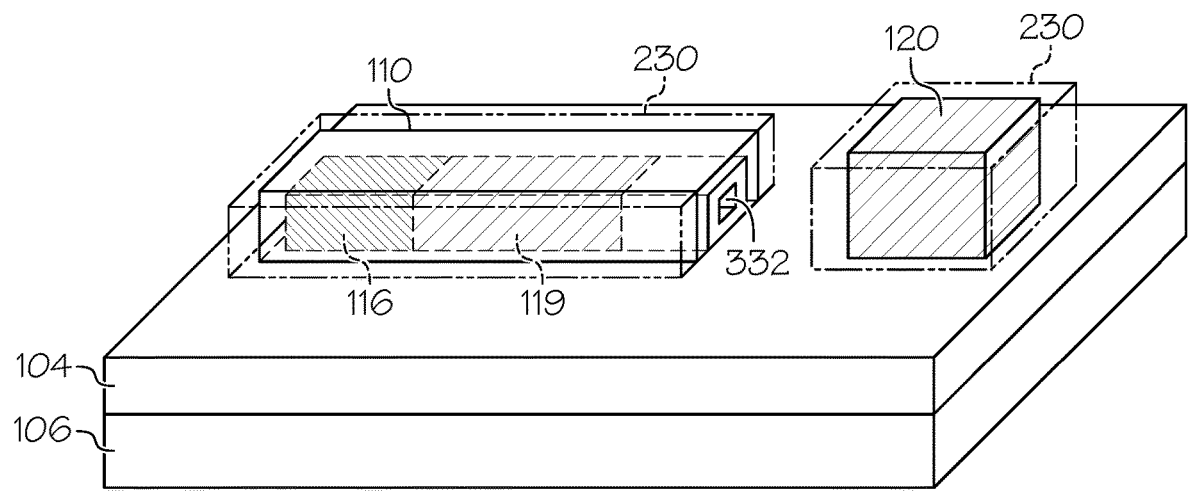
FIG. 3a is a top perspective view and FIG. 3b is a corresponding side view of selective removal of the film of FIG. 2 according to one embodiment of the present invention.
Figure 3B:
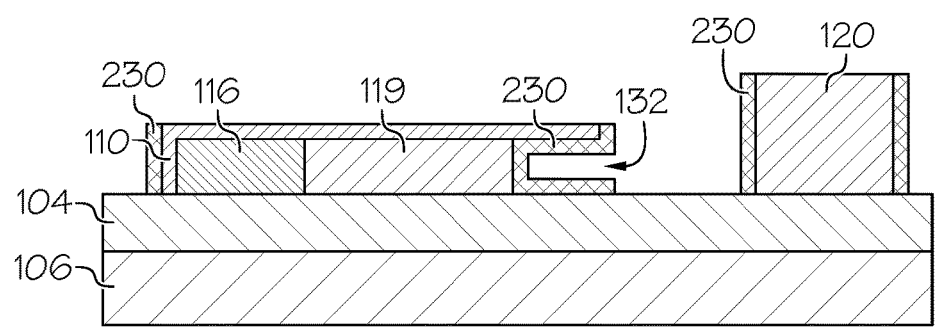

FIG. 3*a* is a top perspective view and FIG. 3*b* shown is a corresponding side view of selective removal of the film 230. Removal can be performed by etching. One type of etching is an un-isotropic dry etch using reactive-ion etching (RIE).

Figure 4A:
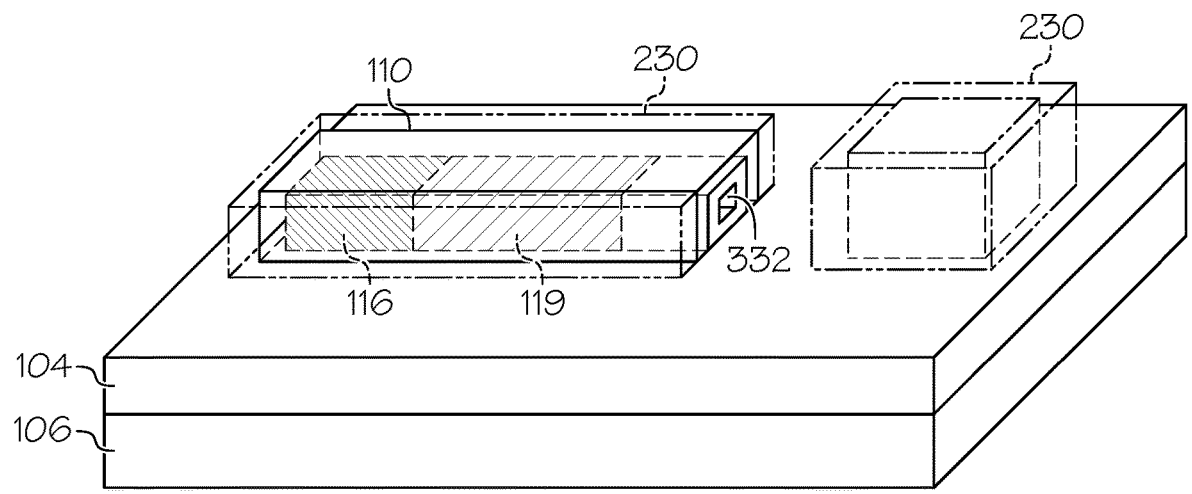
FIG. 4a is a top perspective view and FIG. 4b shown is a corresponding side view of the removal of the undesirable III-V nuclei 120 according to one embodiment of the present invention.
Figure 4B:
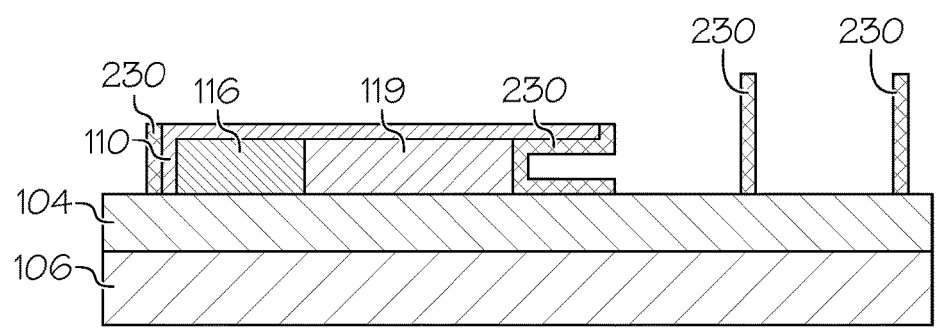

FIG. 4*a* is a top perspective view and FIG. 4*b* shown is a corresponding side view of the removal of the undesirable III-V nuclei 120. In one example the removal can be carried out using aqueous mixture of hydrochloric acid and an oxidizing agent includes a mixture of hydrochloric acid, hydrogen peroxide, and deionized water. A typical concentration ratio for the mix is 1:1:5 $HCl:H_2O_2:H_2O$. This is typically operated in the temperature range of 50-70° C. In another example the removal can be carried out by using a mixture of includes of a mixture of ammonium hydroxide and hydrogen peroxide and deionized water. A typical concentration ratio for the mix is 1:1:5 $NH_4OH:H_2O_2:H_2O$, although ratios as low as 0.05:1:5 are suitable for removing the undesirable III-V nuclei 120. This typically operates in a temperature ranging from 50° C. to 70° C.

Figure 5A:
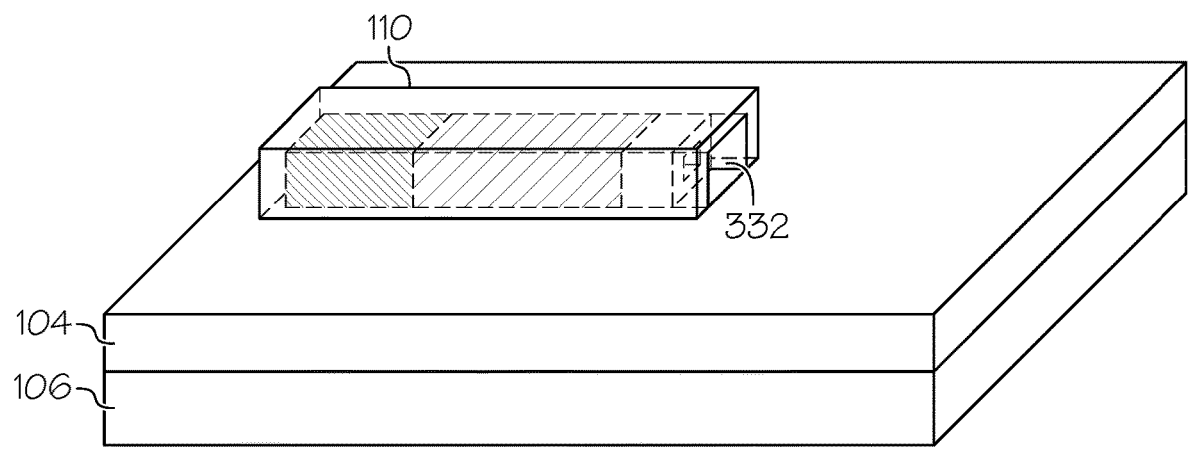
FIG. 5a is a top perspective view and FIG. 5b shown is a corresponding side view of the removal of the remaining film of FIG. 3 according to one embodiment of the present invention.
Figure 5B:
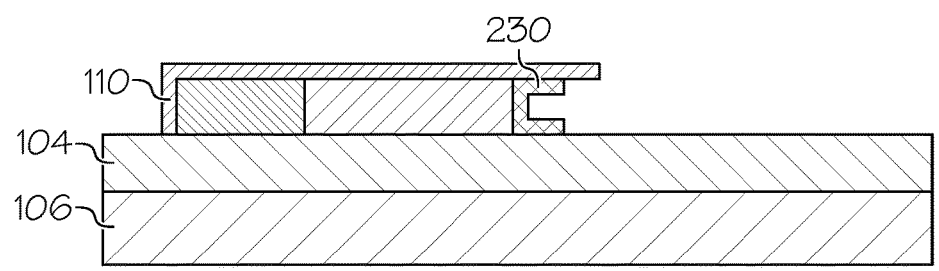

FIG. 5*a* is a top perspective view and FIG. 5*b* shown is a corresponding side view of the removal of the remaining protective film 230 of FIG. 3. In one example the remaining protective film 230 can be removed using either isotropic or anisotropic etch (*Any etching methods selective to 110 and 118 are applicable because 230 inside the tunnel does not need to stay intact), such as reactive ion etching (RIE). In another example the remaining protective film 230 can be removed using inductively coupled plasma (ICP), electron cyclotron resonance ECR), dual frequency capacitive (DFC), helicon, or radial line slot antenna (RLSA) with typical plasma conditions, for example, pressure: much less than 10 mT; bias power: 15 W-150 W; source power: less than or equal to 1 kWs; gases: $BCl_3$, $CHF_3$, $CF_4$ $CH_2F_2$, $CH_3F$, $SF_6$, $Cl_2$, and/or HBr-containing chemistries, to "breakthrough" the native oxide layer and recess a few nm (less than 10 nm) (wet etch can be also used depending upon type of 230, such as diluted HF. In this case, it will etch 110 and 230 at the same time.)

Figure 6A:
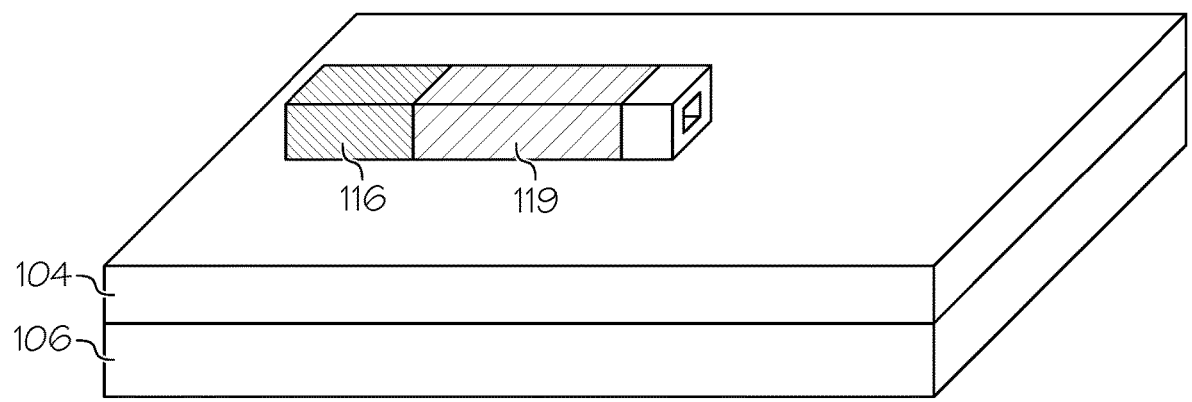
FIG. 6a is a top perspective view and FIG. 6b shown is a corresponding side view of the removal of the remaining layer 110 according to one embodiment of the present invention.
Figure 6B:
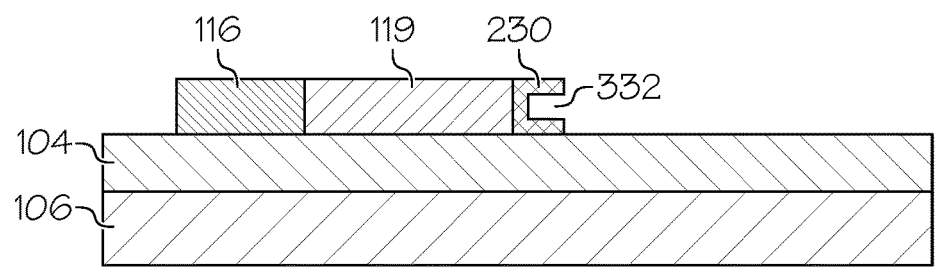
Figure 7:
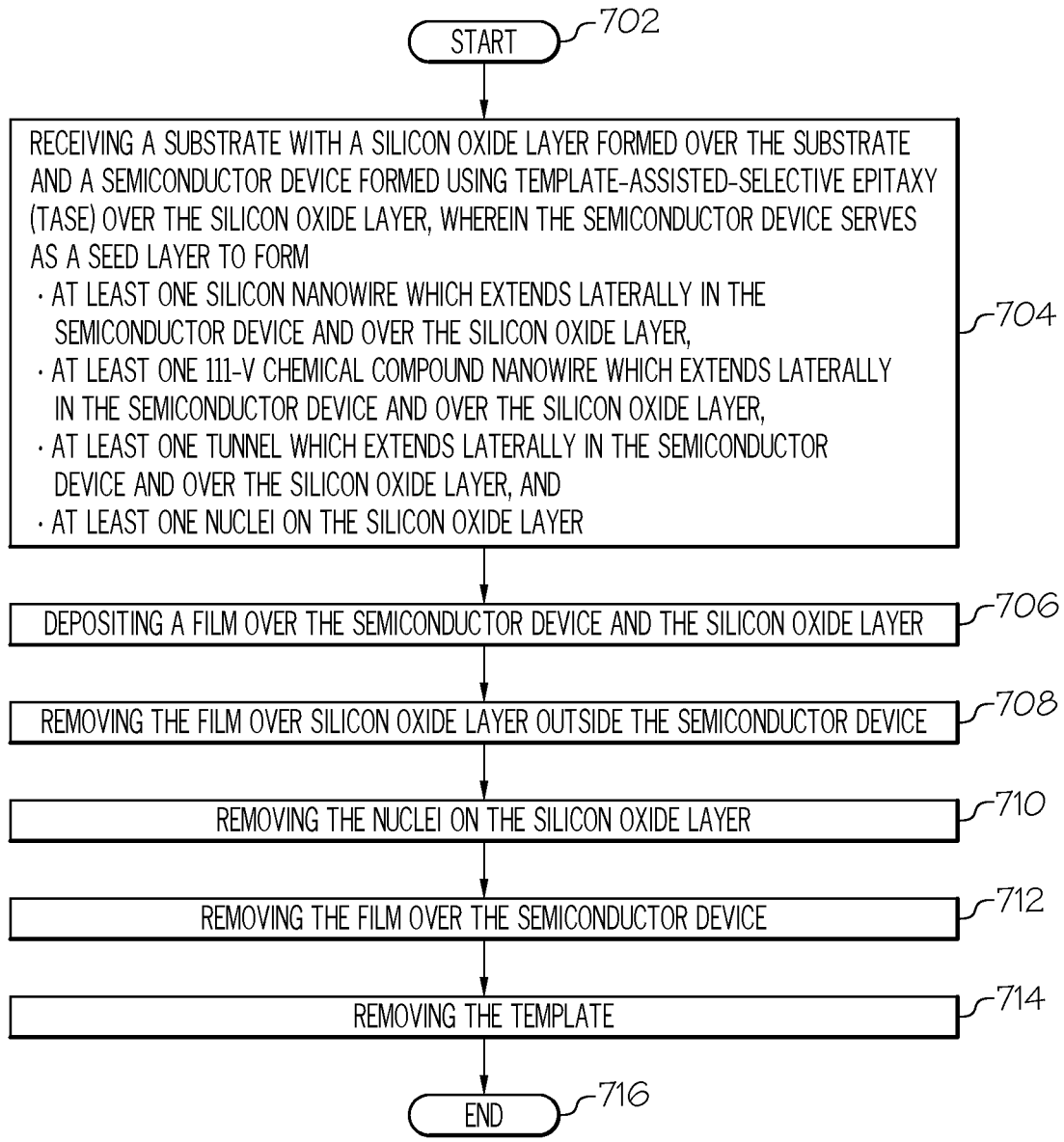
FIG. 7 is a flow diagram illustrating one example of a process for forming a semiconductor device according to one embodiment of the present invention.

FIG. 6*a* is a top perspective view and FIG. 6*b* shown is a corresponding side view of the removal of the remaining layer 110. The remaining layer 110 is removed using diluted HF which will dissolve silicon dioxide while not etching silicon. FIG. 7 is a flow diagram illustrating one example of a process for forming a semiconductor device according an embodiment of the present invention. It should be noted that each of the steps show in FIG. 7 has been discussed in greater detail with respect to FIGS. 1 to 6 above. The process starts in step 702 and immediately proceeds to step 704 in which a substrate with a silicon oxide layer formed over the substrate and a semiconductor device formed using template-assisted-selective epitaxy (TASE) over the silicon oxide layer is received. The semiconductor device serves as a seed layer to form i) at least one silicon nanowire which extends laterally in the semiconductor device and over the silicon oxide layer, ii) at least one tunnel which extends laterally in the semiconductor device and over the silicon oxide layer, and iii) at least one nuclei on the silicon oxide layer. The nanowire in one example is a III-V chemical compound nanowire. Next the process continues to step 706.

In step 706, a protective film 230 is deposited. In one example the film is a $HfO_2$ film that is deposited using atomic layer deposition, over the semiconductor device and the silicon oxide layer. The process continues to step 708.

In step 708 the protective film 230 over silicon oxide layer outside the semiconductor device is removed. This removal can be performed with an un-isotropic dry etch. The process continues to step 710.

In step 710, the nuclei 120 on the silicon oxide layer are removed. In one example the removal can be carried out using aqueous mixture of hydrochloric acid and an oxidizing agent includes a mixture of hydrochloric acid, hydrogen peroxide, and deionized water. In another example the removal can be carried out by using a mixture of includes of a mixture of ammonium hydroxide and hydrogen peroxide and deionized water. The process continues to step 712.

In step 712, the remaining film 230 on oxide is removed. In one example the film 230 can be removed using a reactive ion etching (RIE). In another example the remaining protective film 230 can be removed using inductively coupled plasma (ICP) with $BCl_3$ and/or $CHF_3$. The process continues to step 714.

In step 714 the masking layer or template 110 is removed using on semiconductor device is removed by wet etch, such as dilute dHF dip. The process continues to step 716 in which the process ends.

Although specific embodiments of the invention have been discussed, those having ordinary skill in the art will understand that changes can be made to the specific embodiments without departing from the scope of the invention. The scope of the invention is not to be restricted, therefore, to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also, these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A method for forming a semiconductor device, the method comprising:
    receiving a substrate with a silicon oxide layer formed over the substrate and a nano-wire based semiconductor device formed using template-assisted-selective epitaxy (TASE) over the silicon oxide layer, wherein the nano-wire based semiconductor device serves as a seed layer to form at least one nuclei on the silicon oxide layer;
    depositing a masking layer over the nano-wire based semiconductor device;
    depositing a protective film over the nano-wire based semiconductor device and the silicon oxide layer;
    selectively removing the protective film over the masking layer on the nano-wire based semiconductor device and outside the nano-wire based semiconductor device;
    removing the nuclei on the silicon oxide layer outside the nano-wire based semiconductor device;
    removing the protective film outside the nano-wire based semiconductor device; and
    removing the masking layer over the nano-wire based semiconductor device.

2. The method of claim 1, wherein the nano-wire based semiconductor device further serves as a seed layer to form
    at least one silicon nanowire which extends laterally in the nano-wire based semiconductor device and over the silicon oxide layer,
    at least one tunnel which extends laterally in the nano-wire based semiconductor device and over the silicon oxide layer.

3. The method of claim 2, wherein the surface of the seed layer being exposed to the tunnel has an area is such that growth of the nanowire proceeds from a single nucleation point on the surface.

4. The method of claim 2, wherein the surface of the seed layer is perpendicular to a longitudinal axis of the tunnel.

5. The method of claim 2, wherein a surface of the seed layer being exposed to the tunnel has an area up to about $2 \times 10^4$ nm2.

6. The method of claim 2, wherein a surface of the seed layer being exposed to the tunnel has an area no greater than about $10^4$ nm2.

7. The method of claim 2, wherein a surface of the seed layer occludes one end of the tunnel.

8. The method of claim 2, wherein the tunnel has one or more branches, defined by the template-assisted-selective epitaxy, extending therefrom.

9. The method of claim 1, wherein the at least one silicon nanowire which extends laterally in the nano-wire based semiconductor device and over the silicon oxide layer is a III-V chemical compound nanowire.

10. The method of claim 9, wherein the selectively removing the protective film over the masking layer on the nano-wire based semiconductor device and outside the nano-wire based semiconductor device uses an isotropic dry etch.

11. The method of claim 1, wherein the depositing the protective film is a $HfO_2$ protective film deposited using atomic layer deposition.

12. The method of claim 1, wherein the removing the nuclei on the silicon oxide layer outside the nano-wire based semiconductor device is performed using a mixture of hydrochloric acid and an oxidizing agent including a mixture of hydrochloric acid, hydrogen peroxide, and deionized water.

13. The method of claim 1, wherein the removing the nuclei on the silicon oxide layer outside the nano-wire based semiconductor device is performed using a mixture of ammonium hydroxide and hydrogen peroxide and deionized water.

14. The method of claim 1, wherein the removing the protective film outside the nano-wire based semiconductor device using reactive ion etching.

15. The method of claim 1, wherein the removing the protective film outside the nano-wire based semiconductor device using inductively coupled plasma with $BCL_3$ and/or $CHF_3$.

16. The method of claim 1, wherein the removing the silicon oxide layer over the nano-wire based semiconductor device uses diluted HF or HCl:HF.

17. The method of claim 1, wherein a surface of the seed layer has a width of up to about 100 nm and a breadth, perpendicular to said width, of up to about 100 nm.

18. The method of claim 1, wherein a surface of the seed layer is a monocrystalline semiconductor surface.

19. The method of claim 1, wherein a surface of the seed layer is a surface of consisting of at least one of: an amorphous semiconductor, a polycrystalline semiconductor, a metal, and a metal-semiconductor alloy.

20. A method for forming a semiconductor device, the method comprising:
    receiving a substrate with a silicon oxide layer formed over the substrate and a nano-wire based semiconductor device formed using template-assisted-selective epitaxy (TASE) over the silicon oxide layer, wherein the nano-wire based semiconductor device serves as a seed layer to form
        at least one silicon nanowire which extends laterally in the nano-wire based semiconductor device and over the silicon oxide layer,
        at least one tunnel which extends laterally in the nano-wire based semiconductor device and over the silicon oxide layer, and
        at least one nuclei on the silicon oxide layer;
    depositing a masking layer over the nano-wire based semiconductor device;
    depositing a $HfO_2$ protective film deposited using atomic layer deposition over the nano-wire based semiconductor device and the silicon oxide layer;
    selectively removing the $HfO_2$ protective film over the masking layer on the nano-wire based semiconductor device and outside the nano-wire based semiconductor device;
    removing the nuclei on the silicon oxide layer outside the nano-wire based semiconductor device using a mixture of hydrochloric acid and an oxidizing agent or a mixture of ammonium hydroxide and hydrogen peroxide and deionized water;

removing the $HfO_2$ protective film outside the nano-wire based semiconductor device using one of reactive ion etching or inductively coupled plasma; and
removing the masking layer over the nano-wire based semiconductor device.

\* \* \* \* \*